(12) United States Patent
Shiota et al.

(10) Patent No.: US 11,031,062 B2
(45) Date of Patent: Jun. 8, 2021

(54) MAGNETIC MEMORY DEVICE AND METHOD FOR CONTROLLING A WRITE PULSE

(71) Applicant: National Institute of Advanced Industrial Science and Technology, Chiyoda-ku (JP)

(72) Inventors: Yoichi Shiota, Tsukuba (JP); Takayuki Nozaki, Tsukuba (JP); Shinji Yuasa, Tsukuba (JP)

(73) Assignee: National Institute of Advanced Industrial Science and Technology, Chiyoda (JP)

( * ) Notice: Subject to any disclaimer, the term of this patent is extended or adjusted under 35 U.S.C. 154(b) by 0 days.

(21) Appl. No.: 16/603,343

(22) PCT Filed: Apr. 4, 2018

(86) PCT No.: PCT/JP2018/014417
§ 371 (c)(1),
(2) Date: Oct. 7, 2019

(87) PCT Pub. No.: WO2018/198696
PCT Pub. Date: Nov. 1, 2018

(65) Prior Publication Data
US 2020/0035283 A1 Jan. 30, 2020

(30) Foreign Application Priority Data

Apr. 28, 2017 (JP) .............................. JP2017-090382

(51) Int. Cl.
*G11C 11/16* (2006.01)
*H01L 43/02* (2006.01)
(Continued)

(52) U.S. Cl.
CPC ........ *G11C 11/1675* (2013.01); *G11C 11/161* (2013.01); *H01L 43/02* (2013.01);
(Continued)

(58) Field of Classification Search
CPC .............. G11C 11/1675; G11C 11/161; G11C 11/1659; H01L 43/02; H01L 43/10;
(Continued)

(56) References Cited

U.S. PATENT DOCUMENTS

2011/0026322 A1  2/2011  Ohmori et al.
2011/0049659 A1  3/2011  Suzuki et al.
(Continued)

FOREIGN PATENT DOCUMENTS

JP    2014-67929 A      4/2014
WO    WO2009/128485 A1  10/2009
WO    WO2009/133650 A1  11/2009

OTHER PUBLICATIONS

International Search Report dated Jun. 19, 2018 in PCT/JP2018/014417 filed Apr. 4, 2018.

*Primary Examiner* — Jerome Leboeuf
(74) *Attorney, Agent, or Firm* — Oblon, McClelland, Maier & Neustadt, L.L.P.

(57) ABSTRACT

According to one embodiment, a magnetic memory device includes a stacked body and a controller. The stacked body includes a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer. A resistance value per unit area of the nonmagnetic layer exceeds 20 $\Omega\mu m^2$. The controller is electrically connected to the first conductive layer and the second conduc- (Continued)

tive layer, and supplies a write pulse to the stacked body in a first operation. The write pulse includes a rise period, a potential of the write pulse changing from a first potential toward a second potential in the rise period, an intermediate period of the second potential after the rise period, and a fall period after the intermediate period, the potential of the write pulse changing from the second potential toward the first potential in the fall period. A duration of the fall period is longer than a duration of the rise period.

20 Claims, 4 Drawing Sheets

(51) Int. Cl.
*H01F 10/32* (2006.01)
*H01L 43/10* (2006.01)

(52) U.S. Cl.
CPC ...... *G11C 11/1659* (2013.01); *H01F 10/3254* (2013.01); *H01L 43/10* (2013.01)

(58) Field of Classification Search
CPC ... H01L 21/8239; H01L 27/105; H01L 29/82; H01F 10/3254
See application file for complete search history.

(56) References Cited

U.S. PATENT DOCUMENTS

| | | | |
|---|---|---|---|
| 2013/0215673 A1* | 8/2013 | Zhou | G11C 11/1675 365/158 |
| 2014/0085969 A1 | 3/2014 | Saida et al. | |
| 2018/0090671 A1* | 3/2018 | Kato | H01L 27/228 |
| 2018/0277185 A1* | 9/2018 | Shimizu | G11C 11/1697 |

* cited by examiner

MAGNETIC MEMORY DEVICE AND METHOD FOR CONTROLLING A WRITE PULSE

TECHNICAL FIELD

Embodiments of the invention relate to a magnetic memory device and a method for controlling the same.

BACKGROUND ART

Stable operations of a magnetic memory device are desirable.

PRIOR ART DOCUMENT

Patent Document

[Patent Document 1] International Publication 2009/133650
[Patent Document 2] JP 2014-67929 A (Kokai)

SUMMARY OF INVENTION

Problem to be Solved by the Invention

Embodiments of the invention provide a magnetic memory device and a method for controlling the magnetic memory device in which operations can be stabilized.

Means for Solving the Problem

According to an embodiment of the invention, a magnetic memory device includes a stacked body and a controller. The stacked body includes a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer. A resistance value per unit area of the nonmagnetic layer exceeds 20 $\Omega\mu m^2$. The controller is electrically connected to the first conductive layer and the second conductive layer and supplies a write pulse to the stacked body in a first operation. The write pulse includes a rise period in which a potential of the write pulse changes from a first potential toward a second potential, an intermediate period of the second potential after the rise period, and a fall period after the intermediate period in which the potential of the write pulse changes from the second potential toward the first potential. A duration of the fall period is longer than a duration of the rise period.

According to another embodiment of the invention, a magnetic memory device includes a stacked body, a first interconnect, a second interconnect, and a controller. The stacked body includes a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer. A resistance value per unit area of the nonmagnetic layer exceeds 20 $\Omega\mu m^2$. The controller is electrically connected to one end of the first interconnect; and the first conductive layer is electrically connected to an other end of the first interconnect. The controller is electrically connected to one end of the second interconnect; and the second conductive layer is electrically connected to an other end of the second interconnect. The controller is electrically connected to the first conductive layer and the second conductive layer and supplies a write pulse between the one end of the first interconnect and the one end of the second interconnect in a first operation. The write pulse includes a rise period in which a potential of the write pulse changes from a first potential toward a second potential, an intermediate period of the second potential after the rise period, and a fall period after the intermediate period in which the potential of the write pulse changes from the second potential toward the first potential. A duration of the fall period is longer than a duration of the rise period.

According to another embodiment of the invention, a magnetic memory device includes a stacked body and a controller. The stacked body includes a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer. The controller includes an output circuit electrically connected to the first conductive layer and the second conductive layer. The output circuit outputs a write pulse in a first operation. A resistance value per unit area of the nonmagnetic layer exceeds 20 $\Omega\mu m^2$. The write pulse includes a rise period in which a potential of the write pulse changes from a first potential toward a second potential, an intermediate period of the second potential after the rise period, and a fall period after the intermediate period in which the potential of the write pulse changes from the second potential toward the first potential. A duration of the fall period is longer than a duration of the rise period.

Effects of the Invention

According to embodiments of the invention, a magnetic memory device and a method for controlling the magnetic memory device can be provided in which operations can be stabilized.

EMBODIMENTS OF INVENTION

Figure 1A:
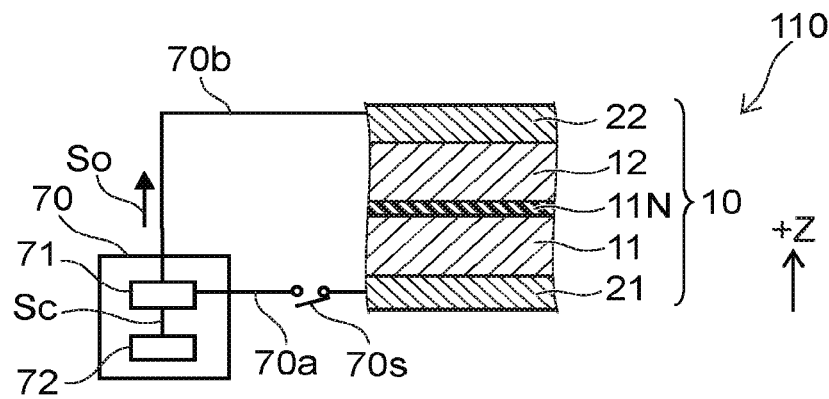
FIG. 1A to FIG. 1C are schematic views illustrating a magnetic memory device according to an embodiment.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

Figure 1B:
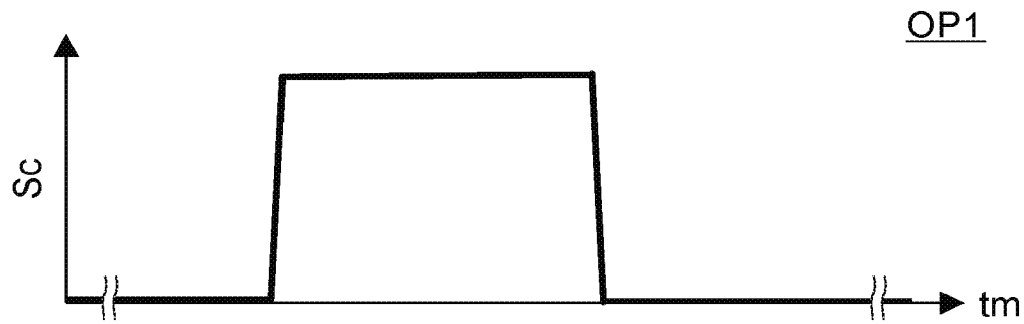
Figure 1C:
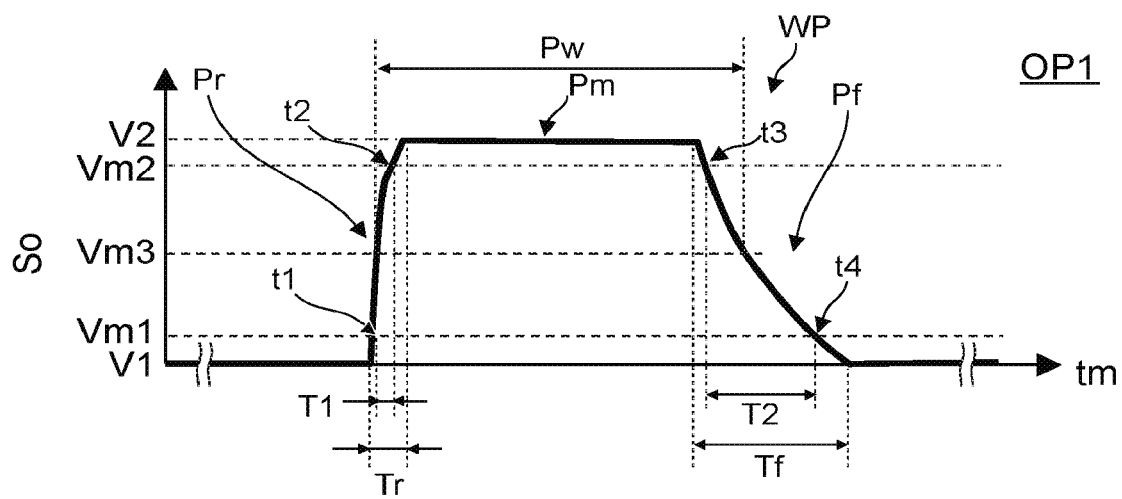

FIG. 1A to FIG. 1C are schematic views illustrating a magnetic memory device according to an embodiment.

FIG. 1A is a schematic cross-sectional view. FIG. 1B and FIG. 1C are schematic views illustrating pulse waveforms of the magnetic memory device.

As shown in FIG. 1A, the magnetic memory device 110 according to the embodiment includes a stacked body 10 and a controller 70. The stacked body 10 includes a first conductive layer 21, a second conductive layer 22, a first magnetic layer 11, a second magnetic layer 12, and a nonmagnetic layer 11N.

The first magnetic layer 11 is provided between the first conductive layer 21 and the second conductive layer 22. The second magnetic layer 12 is provided between the first magnetic layer 11 and the second conductive layer 22. The nonmagnetic layer 11N is provided between the first magnetic layer 11 and the second magnetic layer 12.

The controller 70 is electrically connected to the first conductive layer 21 and the second conductive layer 22. The stacked body 10 is, for example, one memory portion (memory cell). The controller 70 controls the memory cell.

For example, a first interconnect 70a and a second interconnect 70b are provided. The controller 70 is electrically connected to one end of the first interconnect 70a. The first conductive layer 21 is electrically connected to the other end of the first interconnect 70a. The controller 70 is electrically connected to one end of the second interconnect 70b. The second conductive layer 22 is electrically connected to the other end of the second interconnect 70b.

In the example, a switch 70s is provided in the second interconnect 70b. The switch 70s is, for example, a select transistor, etc. Thus, the state in which a switch or the like is provided in the current path also is included in the state of being electrically connected. In the description hereinbelow, the switch 70s is in the ON-state. In the ON-state, a current flows in the interconnect (in the example, the second interconnect 70b).

In the example, the controller 70 includes an output circuit 71 and a control circuit 72. For example, a control signal Sc (e.g., a write control signal) is supplied from the control circuit 72 to the output circuit 71. The output circuit 71 supplies an output signal So to an interconnect (in the example, the first interconnect 70a). The output signal So is a signal based on the control signal Sc.

FIG. 1B illustrates the control signal Sc. FIG. 1C illustrates the output signal So. In these figures, the horizontal axis is a time tm. The vertical axis of FIG. 1B corresponds to the potential of the control signal Sc. The potential of FIG. 1C corresponds to the potential of the output signal So. The vertical axis of FIG. 1C corresponds to the potential of a write pulse that is described below and is included in the output signal So.

As shown in FIG. 1B and FIG. 1C, the output signal So is output according to the control signal Sc (e.g., the control pulse).

In a first operation OP1 as shown in FIG. 1C, the controller 70 supplies a write pulse WP to the stacked body 10. The write pulse WP is included in the output signal So.

For example, the write pulse WP is a pulse having a positive polarity. The potential of the first conductive layer 21 and the potential of the second conductive layer 22 are mutually-interchangeable by interchanging the reference of the potential. Accordingly, the write pulse WP may be a pulse having a negative polarity. In the description hereinbelow, the write pulse WP is taken to be a pulse having a positive polarity.

The write pulse WP includes a rise period Pr, an intermediate period Pm, and a fall period Pf. In the rise period Pr, the potential of the write pulse WP changes from a first potential V1 toward a second potential V2. The intermediate period Pm is a period after the rise period Pr. The potential of the write pulse WP is the second potential V2 in the intermediate period Pm. The fall period Pf is a period after the intermediate period Pm. In the fall period Pf, the potential of the write pulse WP changes from the second potential V2 toward the first potential V1.

In the embodiment, the duration of the fall period Pf (a fall time Tf) is longer than the duration of the rise period Pr (a rise time Tr). Thus, for example, it was found that the operations can be stabilized by using a pulse waveform in which the fall is slower than the rise. As described below, for example, it was found that the write errors can be suppressed.

There are cases where it is difficult to define the time until the waveform of the write pulse WP stabilizes. In such a case, for convenience, the duration of the rise period Pr and the duration of the fall period Pf may be determined using the time when the height of the write pulse WP becomes 10% and the time when the height of the write pulse WP becomes 90%.

In the write pulse WP as shown in FIG. 1C, the height of the write pulse WP corresponds to the difference between the first potential V1 and the second potential V2. The potential that is 0.1 times the difference is taken as a first intermediate potential Vm1. The potential that is 0.9 times the difference is taken as a second intermediate potential Vm2. A first time t1 to a fourth time t4 recited below can be determined using these intermediate potentials.

The first time t1 and the second time t2 are in the rise period Pr. The second time t2 is after the first time t1. The write pulse WP is the first intermediate potential Vm1 at the first time t1. The difference between the first potential V1 and the first intermediate potential Vm1 is 0.1 times the height of the pulse (the difference between the first potential V1 and the second potential V2). The write pulse WP is the second intermediate potential Vm2 at the second time t2. The difference between the first potential V1 and the second intermediate potential Vm2 is 0.9 times the height of the pulse (the difference between the first potential V1 and the second potential V2).

On the other hand, the third time t3 and the fourth time t4 are in the fall period Pf. The fourth time t4 is after the third time t3. The write pulse WP is the second intermediate potential Vm2 recited above at the third time t3. The write pulse WP is the first intermediate potential Vm1 at the fourth time t4.

The difference between the first time t1 and the second time t2 is taken as a first duration T1. The difference between the third time t3 and the fourth time t4 is taken as a second duration T2. In the embodiment, the second duration T2 is longer than the first duration T1.

For example, it was found that the write errors can be suppressed by using the write pulse WP including a fall that is gradual compared to the rise. This was discovered by experiments performed independently by the inventor of the application. The experiments will now be described.

In the experiments, voltage pulses that have various waveforms are applied to the stacked body 10 illustrated in FIG. 1A. In a first experiment, the rise time Tr is the same as the fall time Tf; and the durations of the rise time Tr and the fall time Tf are modified. In a second experiment, the fall time Tf is constant; and the rise time Tr is modified. The fall time Tf in this case is 30 ps (picoseconds); and the fall is sufficiently steep. In a third experiment, the rise time Tr is constant; and the fall time Tf is modified. The rise time Tr in this case is 30 ps; and the fall is sufficiently steep. Such voltage pulses are generated by a programmable pulse generator.

The sample of the experiments has the following configuration. In the following description, the values inside the parentheses each are the thicknesses of the films.

The first conductive layer 21 is a stacked film including a first Ru film (5 nm)/first Ta film (40 nm)/Cu film (100 nm)/second Ta film (5 nm). A Cu film is provided between the second Ta film and the first magnetic layer 11. The first Ta film is provided between the Cu film and the first magnetic layer 11. The first Ru film is provided between the first Ta film and the first magnetic layer 11.

The first magnetic layer 11 is a stacked film including a $Co_{70}Fe_{30}$ film (0.4 nm)/$(Co_{35}Fe_{65})_{80}B_{20}$ film (2.1 nm)/second Ru film (0.85 nm)/$Co_{70}Fe_{30}$ film (2.5 nm)/IrMn film (7 nm). The $Co_{70}Fe_{30}$ film is provided between the IrMn film and the nonmagnetic layer 11N. The second Ru film is provided between the $Co_{70}Fe_{30}$ film and the nonmagnetic layer 11N. The $(Co_{35}Fe_{65})_{80}B_{20}$ film is provided between the second Ru film and the nonmagnetic layer 11N. The $Co_{70}Fe_{30}$ film is provided between the $(Co_{35}Fe_{65})_{80}B_{20}$ film and the nonmagnetic layer 11N.

The nonmagnetic layer 11N is MgO (about 1.5 nm). The resistance value per unit area of the nonmagnetic layer 11N is 556 $\Omega\mu m^2$. The second magnetic layer 12 is an $Fe_{80}B_{20}$ film (1.9 nm).

The second conductive layer 22 is a stacked film including a Pt film (2 nm)/third Ru film (7 nm)/W film (5 nm). The third Ru film is provided between the Pt film and the second magnetic layer 12. The W film is provided between the third Ru film and the second magnetic layer 12.

Figure 2A:
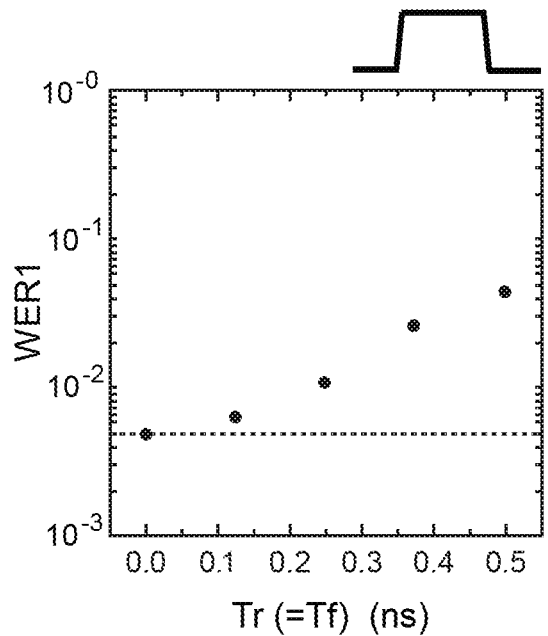
FIG. 2A to FIG. 2C are graphs illustrating experiment results.
Figure 2B:
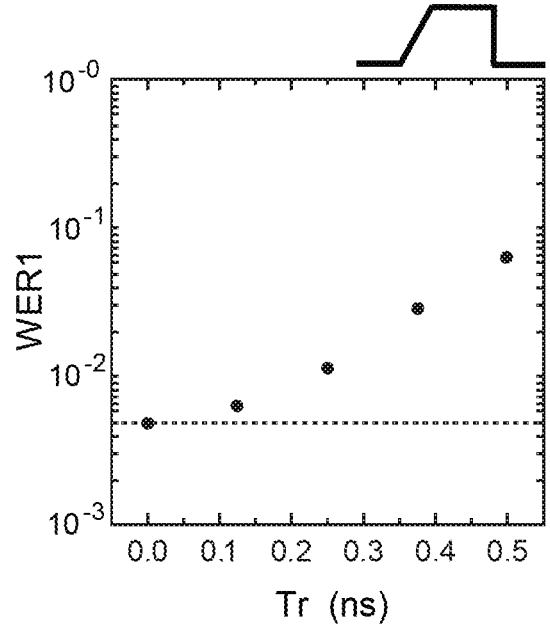
Figure 2C:
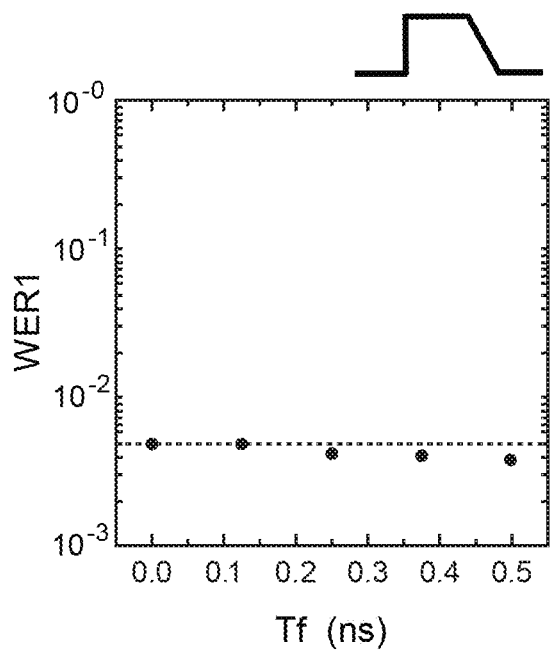

FIG. 2A to FIG. 2C are graphs illustrating experiment results.

FIG. 2A shows the results of the first experiment. FIG. 2B shows the results of the second experiment. FIG. 2C shows the results of the third experiment. In these figures, the horizontal axis is the rise time Tr or the fall time Tf. The vertical axis is a write error rate WER1. In these figures, the durations of these times are 30 ps at the plot where the rise time Tr or the fall time Tf is "0.0." In the experiments, a pulse width Pw of the write pulse WP (referring to FIG. 1C) is 0.75 ns. As shown in FIG. 1C, a potential that is 0.5 times the difference between the second potential V2 and the first potential V1 is taken as a third intermediate potential Vm3. The pulse width Pw is the duration from the time when the potential of the write pulse WP becomes the third intermediate potential Vm3 in the rise period Pr to the time when the potential of the write pulse WP becomes the third intermediate potential Vm3 in the fall period Pf.

As shown in FIG. 2A, in the first experiment in which the rise time Tr is the same as the fall time Tf, the write error rate WER1 increases as the durations of these times lengthen.

As shown in FIG. 2B, in the second experiment in which the fall is steep and the rise time Tr is modified, the write error rate WER1 increases as the rise time Tr lengthens.

Conversely, as shown in FIG. 2C, in the third experiment in which the rise is steep and the fall time Tf is modified, a low write error rate WER1 is obtained even when the rise time Tr lengthens.

For example, in the third experiment, the write error rate WER1 is markedly smaller when the fall time Tf is 0.25 ns (nanoseconds) or more than when the fall time Tf is 30 ps.

For example, as in the third experiment, it was found that the write error rate WER1 can be reduced by using a write pulse in which the rise is steep and the fall time Tf is long.

For example, the magnetization of the magnetic layer inside the stacked body 10 changes due to the application of the write pulse WP. It is considered that the magnetization transitions to a stable state while precessing when the application of the write pulse WP ends (when falling). It is estimated that perhaps the stability of the precession is increased by using the write pulse WP having the long fall time Tf.

FIG. 2A and FIG. 2B are compared. In FIG. 2A, the write error rate WER1 is about $5 \times 10^{-2}$ when the rise time Tr (i.e., the fall time Tf) is 0.5 ns. On the other hand, in FIG. 2B, the write error rate WER1 is about $6.5 \times 10^{-2}$ when the rise time Tr is 0.5 ns. In other words, the write error rate WER1 of the second experiment (the fall being slow and the fall being fast) is higher than the write error rate WER1 of the first experiment (both the rise and the fall being slow). Therefore, it is considered that a slow fall reduces the write error rate WER1.

Also, the write error rate WER1 is lower for the third experiment (the rise being fast and the fall being slow) than for the first experiment (both the rise and the fall being slow).

In the embodiment, the fall time Tf is longer than the rise time Tr. For example, the second duration T2 is longer than the first duration T1 (referring to FIG. 1C). Thereby, for example, a low write error rate WER1 is obtained. According to the embodiment, for example, a magnetic memory device can be provided in which the operations can be stabilized.

In the embodiment, for example, the second duration T2 is not less than 0.3 times the pulse width Pw of the write pulse WP (referring to FIG. 1C).

In the embodiment, for example, the second duration T2 is not less than 2 times the first duration T1. A low write error rate WER1 is obtained thereby. For example, the second duration T2 may be not less than 4 times the first duration T1. An even lower write error rate WER1 is obtained thereby. For example, the second duration T2 may be not less than 8 times the first duration T1. An even lower write error rate WER1 is obtained stably thereby. For example, the first duration T1 is 0.08 nanoseconds or less. In such a case, for example, the second duration T2 is 0.1 nanoseconds or more.

For example, the duration of the fall period Pr (the fall time Tf) is not less than 2 times the duration of the rise period (the rise time Tr). A low write error rate WER1 is obtained thereby. For example, the rise time Tr may be not less than 4 times the fall time Tf. An even lower write error rate WER1 is obtained thereby. For example, the rise time Tr may be not less than 8 times the fall time Tf. An even lower write error rate WER1 is obtained stably thereby. For example, the rise time Tr is 0.1 nanoseconds or less. In such a case, for example, the fall time Tf is 0.15 nanoseconds or more.

One example of the controller 70 outputting the write pulse WP according to the embodiment will now be described.

FIG. 3A to FIG. 3D are schematic views illustrating the magnetic memory device according to the embodiment.

Figure 3A:
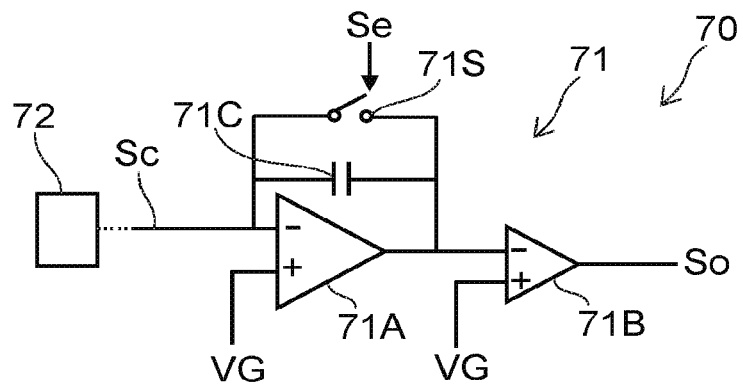
FIG. 3A to FIG. 3D are schematic views illustrating the magnetic memory device according to the embodiment.
Figure 3B:
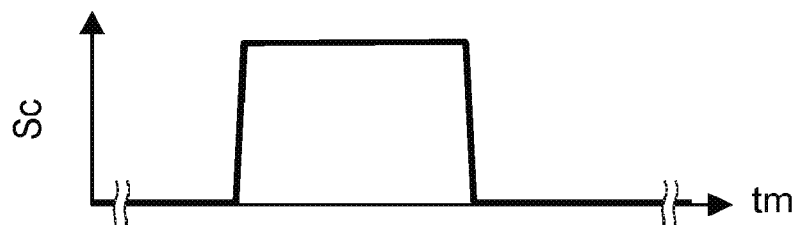
Figure 3C:
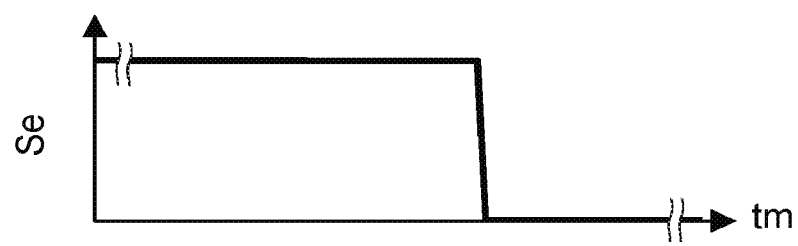
Figure 3D:
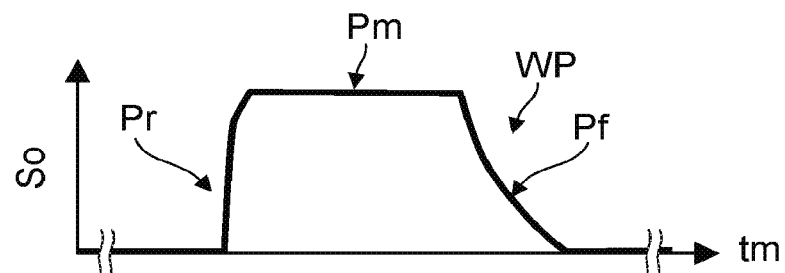

FIG. 3A is a circuit diagram illustrating the controller 70. FIG. 3B is a schematic view illustrating the control signal Sc. FIG. 3C is a schematic view illustrating an edge signal Se described below. FIG. 3D is a schematic view illustrating the write pulse WP.

As shown in FIG. 3A, the control circuit 72 and the output circuit 71 are provided in the controller 70. The output circuit 71 includes a first amplifier 71A. The control signal Sc is input to the negative input of the first amplifier 71A. The control signal Sc is supplied from the control circuit 72. For example, the positive input of the first amplifier 71A is set to a ground potential VG. A capacitance 71C and a control switch 71S are connected in parallel between the output of the first amplifier 71A and the negative input of the first amplifier 71A. The control switch 71S is controlled by the edge signal Se. In the example, the output of the first amplifier 71A is output to the negative input of a second amplifier 71B. For example, the positive input of the second amplifier 71B is set to the ground potential VG. For example, the inverted signal of the output of the first amplifier 71A is output from the second amplifier 71B. The output of the second amplifier 71B corresponds to the output signal So.

As shown in FIG. 3B, a write control pulse for outputting the write pulse WP is output as the control signal Sc.

As shown in FIG. 3C, the edge signal Se changes from the ON-state to the OFF-state at the fall of the control signal Sc. For example, such an edge signal Se is obtained using a differential circuit, etc.

When the edge signal Se is in the ON-state, the capacitance 71C that is provided in the first amplifier 71A is shorted. Therefore, the time constant at this time is short. On the other hand, when the edge signal Se is set to the OFF-state, the time constant becomes large due to the capacitance 71C.

Therefore, as shown in FIG. 3D, the rise of the output signal So (the write pulse WP) is fast; and the fall is slow.

For example, the write pulse WP such as that shown in FIG. 3D is obtained by such a circuit. The circuit recited above is an example; and various circuits may be used in the embodiment.

In the embodiment, the write pulse WP is the voltage waveform between one end of the first interconnect 70a and one end of the second interconnect 70b. For example, the one end of the first interconnect 70a recited above is connected to the controller 70. The one end of the second interconnect 70b recited above is connected to the controller 70.

As recited above, the controller 70 includes the output circuit 71 electrically connected to the first conductive layer 21 and the second conductive layer 22. The write pulse WP is, for example, the output waveform of the output circuit 71.

In the embodiment, the electrical resistance between the first conductive layer 21 and the second conductive layer 22 changes due to the write pulse WP. For example, the electrical resistance between the first conductive layer 21 and the second conductive layer 22 before the supply of the write pulse WP is taken as a first electrical resistance. The electrical resistance between the first conductive layer 21 and the second conductive layer 22 after the supply of the write pulse WP is taken as a second electrical resistance. The second electrical resistance is different from the first electrical resistance. It is considered that this is because the magnetization of one of the first magnetic layer 11 or the second magnetic layer 12 changes due to the application of the write pulse WP.

In the embodiment, one of the first magnetic layer 11 or the second magnetic layer 12 is a reference layer. The other of the first magnetic layer 11 or the second magnetic layer 12 is a free layer. For example, the magnetization of the free layer changes easily compared to the magnetization of the reference layer. For example, the first magnetic layer 11 is the reference layer; and the second magnetic layer 12 is the free layer.

For example, the direction from the first magnetic layer 11 toward the second magnetic layer 12 is taken as a +Z direction (upward) (referring to FIG. 1A). For example, the magnetization (a first magnetization) of the first magnetic layer 11 is oriented substantially in the +Z direction (upward). In the state of one state, the magnetization (a second magnetization) of the second magnetic layer 12 has a component in the +Z direction (upward). In another one state, the magnetization (the second magnetization) of the second magnetic layer 12 has a component in the −Z direction (downward).

For example, the second magnetization has the upward orientation due to the application of the write pulse WP. At this time, the two magnetizations of the first magnetic layer 11 and the second magnetic layer 12 are "parallel."

For example, the second magnetization may have the downward orientation due to the application of the write pulse WP. At this time, the two magnetizations of the first magnetic layer 11 and the second magnetic layer 12 are "antiparallel."

For example, the angle between the first magnetization and the second magnetization after the write pulse WP is applied is different from the angle between the first magnetization and the second magnetization before the write pulse WP is applied. For example, the two magnetizations are "antiparallel" before the write pulse WP is applied. For example, the two magnetizations become "parallel" after the write pulse WP is applied. When "antiparallel," for example, the angle between the first magnetization and the second magnetization exceeds 90 degrees and is not more than 180 degrees. When "parallel," for example, the angle between the first magnetization and the second magnetization is not less than 0 degrees but less than 90 degrees.

For example, one of the "parallel" state or the "antiparallel" state corresponds to the information of "0." The other of the "parallel" state or the "antiparallel" state corresponds to the information of "1." This information is stored in the stacked body 10 (the memory cell).

For example, when "1" is stored in the memory cell before the supply of the write pulse WP, the write pulse WP is supplied in the case where "0" is to be written to the memory cell. When "1" is stored in the memory cell before the supply of the write pulse WP, the write pulse WP is not supplied in the case where the memory cell is to remain in the state of "1."

On the other hand, for example, when "0" is stored in the memory cell before the supply of the write pulse WP, the write pulse WP is supplied in the case where "1" is to be written to the memory cell. When "0" is stored in the memory cell before the supply of the write pulse WP, the write pulse WP is not supplied in the case where the memory cell is to remain in the state of "0."

Thus, the write pulse WP is supplied to the stacked body 10 when modifying the information written to the memory cell. The write pulse WP is, for example, a pulse that modifies the state.

In the embodiment, for example, the state of the memory cell is read; and it is determined whether or not to modify from this state. For example, the reading is performed before the supply of the write pulse WP. An example of such an operation will now be described.

Figure 4A:
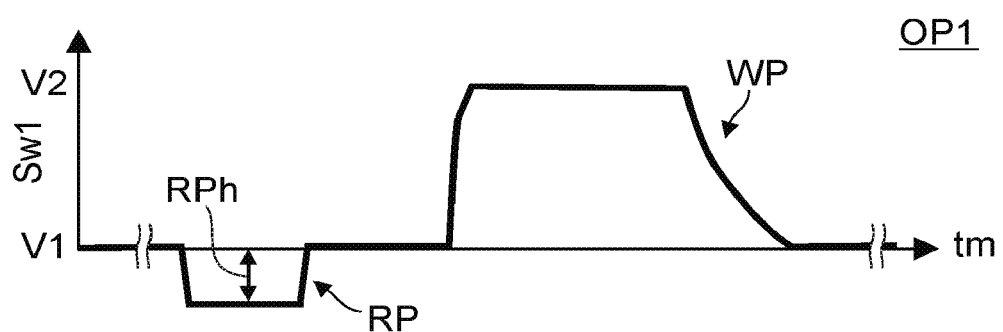
FIG. 4A and FIG. 4B are schematic views illustrating operations of the magnetic memory device according to the embodiment.
Figure 4B:
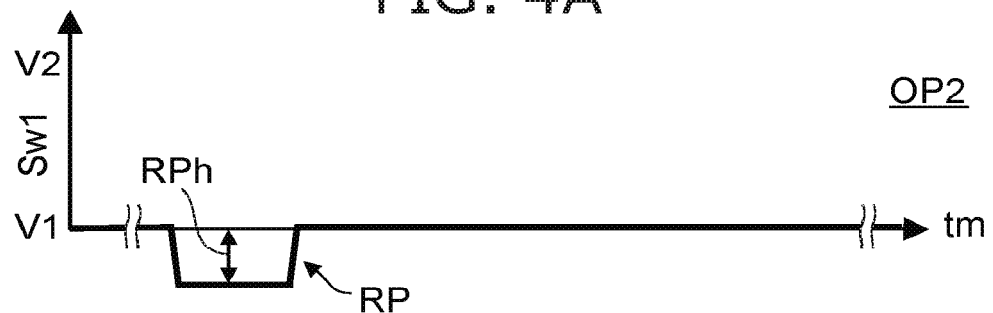

FIG. 4A and FIG. 4B are schematic views illustrating operations of the magnetic memory device according to the embodiment.

FIG. 4A corresponds to the first operation OP1. The first operation OP1 corresponds to the operation of modifying the state of the memory cell. FIG. 4B corresponds to a second operation OP2. The second operation OP2 corresponds to the operation of maintaining the state of the memory cell.

In the first operation OP1 as shown in FIG. 4A, the controller 70 supplies a read pulse RP to the stacked body 10 before the supply of the write pulse WP. The absolute value of a height RPh of the read pulse RP is smaller than the difference between the first potential V1 and the second potential V2. In the example, the write pulse WP is a positive pulse; and the read pulse RP is a negative pulse. In the embodiment, the polarity of the read pulse RP may be the same as the polarity of the write pulse WP.

By such a read pulse RP, for example, it is determined by the controller 70 whether the state of the stacked body 10 (the memory cell) is "0" or "1."

Then, the write pulse WP recited above is supplied when modifying the state of the stacked body 10 (the memory cell).

For example, the first electrical resistance between the first conductive layer 21 and the second conductive layer 22 obtained by the read pulse RP is different from the second electrical resistance between the first conductive layer 21 and the second conductive layer 22 after the supply of the write pulse WP.

For example, when the memory cell is in the "0" state in the state before the first operation OP1, the first electrical resistance that is obtained by the read pulse RP is an electrical resistance corresponding to "0." In this case, the memory cell is modified to the "1" state by the write pulse WP. An electrical resistance difference that corresponds to the difference between these states is generated.

In the second operation OP2 as shown in FIG. 4B, the controller 70 supplies the read pulse RP to the stacked body 10. In this case as well, the absolute value of the height RPh of the read pulse RP is smaller than the difference between the first potential V1 and the second potential V2. In the second operation OP2, the controller 70 does not supply the write pulse WP to the stacked body 10. Thereby, the memory state of the memory cell is maintained in the second operation OP2.

An example of the stacked body 10 will now be described.

The first magnetic layer 11 includes, for example, at least one selected from the group consisting of Fe, Co, Ni, Cr, Mn, Gd, Nd, Sm, and Tb. The number of films included in the first magnetic layer 11 is one, two, or more. The thickness of the first magnetic layer 11 is, for example, not less than 0.5 nm and not more than 10 nm.

The second magnetic layer 12 includes, for example, at least one selected from the group consisting of Fe, Co, Ni, Cr, Mn, Gd, Nd, Sm, and Tb. The number of films included in the second magnetic layer 12 is one, two, or more. The thickness of the second magnetic layer 12 is, for example, not less than 0.5 nm and not more than 10 nm.

The nonmagnetic layer 11N includes, for example, at least one selected from the group consisting of magnesium oxide, silicon oxide, silicon nitride, aluminum oxide, aluminum nitride, germanium oxide, germanium nitride, a rare-earth oxide, and a rare-earth nitride. The nonmagnetic layer 11N is, for example, magnesium oxide. Thereby, for example, a large magnetoresistance change is obtained. The number of films included in the nonmagnetic layer 11N is one, two, or more. The thickness of the nonmagnetic layer 11N is, for example, not less than 0.5 nm and not more than 4 nm. For example, it is favorable for the resistance value per unit area of the nonmagnetic layer 11N to exceed not less than 20 $\mu m^2$ and to be 1,000,000 $\Omega\mu m^2$ or less. It is favorable for the resistance value per unit area of the nonmagnetic layer 11N to be 100 $\Omega\mu m^2$ or more. Thereby, the effects due to the current such as the Joule heat, the spin transfer torque, etc., can be small. It is more favorable for the resistance value per unit area of the nonmagnetic layer 11N to be 500 $\Omega\mu m^2$ or more. The power consumption when writing can be lowered further thereby. To further lower the power consumption when writing, it is most favorable for the resistance value per unit area of the nonmagnetic layer 11N to be 2,000 $\Omega\mu m^2$ or more. High-speed reading becomes difficult if the resistance is high. It is favorable for the resistance value per unit area of the nonmagnetic layer 11N to be 10,000 $\Omega\mu m^2$ or less. High-speed reading is possible thereby. More favorably, the resistance value per unit area of the nonmagnetic layer 11N is 2,000 $\Omega\mu m^2$ or less. More favorably, the resistance value per unit area of the nonmagnetic layer 11N is 500 $\Omega\mu m^2$ or less. For high-speed reading, it is most favorable for the resistance value per unit area of the nonmagnetic layer 11N to be 100 $\Omega\mu m^2$ or less. For example, the information that relates to the resistance value per unit area of the nonmagnetic layer 11N is obtained from the measurement results of the resistance of the element and the measurement results of the size of the element from a SEM (Scanning Electron Microscope), a TEM (Transmission Electron Microscope), etc.

The first conductive layer 21 includes, for example, at least one selected from the group consisting of Ta, Ru, W, Ir, Au, Ag, Cu, Al, Cr, Pt, and Pd. The number of films included in the first conductive layer 21 is one, two, or more. The thickness of the first conductive layer 21 is, for example, not less than 1 nm and not more than 200 nm. When the thickness of the first conductive layer 21 is not less than 1 nm and not more than 200 nm, for example, good flatness and a low resistance value are obtained.

The second conductive layer 22 includes, for example, at least one selected from the group consisting of Ta, Ru, W, Ir, Au, Ag, Cu, Al, Cr, Pt, and Pd. The number of films included in the second conductive layer 22 is one, two, or more. The thickness of the second conductive layer 22 is, for example, not less than 1 nm and not more than 200 nm.

In the embodiment, the magnetic layer may include multiple stacked films. The nonmagnetic layer may include multiple stacked films. The conductive layer may include multiple stacked films.

In the description recited above, the thickness of the layer is the length of the layer along the Z-direction. The descriptions recited above relating to the materials and the layers are examples; and the materials and the layers of the embodiment may be modified.

The magnetic memory device 110 according to the embodiment is, for example, voltage torque-driven MRAM (Magnetoresistive Random Access Memory).

The embodiment may include a method for controlling a magnetic memory device. For example, the control method supplies the write pulse WP to the stacked body 10 in the first operation OP1. The stacked body 10 includes the first conductive layer 21, the second conductive layer 22, the first magnetic layer 11 provided between the first conductive layer 21 and the second conductive layer 22, the second magnetic layer 12 provided between the first magnetic layer 11 and the second conductive layer 22, and the nonmagnetic layer 11N provided between the first magnetic layer 11 and the second magnetic layer 12. The resistance value per unit area of the nonmagnetic layer 11N exceeds 20 $\Omega\mu m^2$. The write pulse WP includes the rise period Pr in which the potential of the write pulse WP changes from the first potential V1 toward the second potential V2, the intermediate period Pm of the second potential V2 after the rise period Pr, and the fall period Pf after the intermediate period Pm in which the potential of the write pulse WP changes from the second potential V2 toward the first potential V1. The duration of the fall period Pf is longer than the duration of the rise period Pr.

In the first operation OP1, the controlling method according to the embodiment supplies the write pulse WP between one end of the first interconnect 70a and one end of the second interconnect 70b. The other end of the first interconnect 70a is electrically connected to the first conductive layer 11 of the stacked body 10 including the first conductive layer 21, the second conductive layer 22, the first magnetic layer 11 provided between the first conductive layer 21 and the second conductive layer 22, the second magnetic layer 12 provided between the first magnetic layer 11 and the second conductive layer 22, and the nonmagnetic layer 11N provided between the first magnetic layer 11 and the second magnetic layer 12. The other end of the second interconnect 70b is electrically connected to the second conductive layer 22. The resistance value per unit area of the nonmagnetic layer 11N exceeds 20 $\Omega\mu m^2$. The write pulse WP includes the rise period Pr in which the potential of the write pulse WP changes from the first potential V1 toward the second potential V2, the intermediate period Pm of the second potential V2 after the rise period Pr, and the fall period Pf after the intermediate period Pm in which the potential of the write pulse WP changes from the second potential V2 toward the first potential V1. The duration of the fall period Pf is longer than the duration of the rise period Pr.

The embodiments may include the following configurations (proposals).

Configuration 1
A magnetic memory device, comprising:
 a stacked body including
  a first conductive layer,
  a second conductive layer,
  a first magnetic layer provided between the first conductive layer and the second conductive layer,
  a second magnetic layer provided between the first magnetic layer and the second conductive layer, and
  a nonmagnetic layer provided between the first magnetic layer and the second magnetic layer; and
 a controller supplying a write pulse to the stacked body in a first operation and being electrically connected to the first conductive layer and the second conductive layer,
 a resistance value per unit area of the nonmagnetic layer exceeding 20 $\Omega\mu m^2$,
 the write pulse including
  a rise period, a potential of the write pulse changing from a first potential toward a second potential in the rise period,
  an intermediate period of the second potential after the rise period, and
  a fall period after the intermediate period, the potential of the write pulse changing from the second potential toward the first potential in the fall period,
 a duration of the fall period being longer than a duration of the rise period.

Configuration 2
A magnetic memory device, comprising:
 a stacked body including
  a first conductive layer,
  a second conductive layer,
  a first magnetic layer provided between the first conductive layer and the second conductive layer,
  a second magnetic layer provided between the first magnetic layer and the second conductive layer, and
  a nonmagnetic layer provided between the first magnetic layer and the second magnetic layer;
 a first interconnect;
 a second interconnect; and
 a controller,
 a resistance value per unit area of the nonmagnetic layer exceeding 20 $\Omega\mu m^2$,
 the controller being electrically connected to one end of the first interconnect, and the first conductive layer being electrically connected to an other end of the first interconnect,
 the controller being electrically connected to one end of the second interconnect, and the second conductive layer being electrically connected to an other end of the second interconnect,
 the controller being electrically connected to the first conductive layer and the second conductive layer and supplying a write pulse between the one end of the first interconnect and the one end of the second interconnect in a first operation,
 the write pulse including
  a rise period, a potential of the write pulse changing from a first potential toward a second potential in the rise period,
  an intermediate period of the second potential after the rise period, and
  a fall period after the intermediate period, the potential of the write pulse changing from the second potential toward the first potential in the fall period,
 a duration of the fall period being longer than a duration of the rise period.

Configuration 3
A magnetic memory device, comprising:
 a stacked body including
  a first conductive layer,
  a second conductive layer,
  a first magnetic layer provided between the first conductive layer and the second conductive layer,
  a second magnetic layer provided between the first magnetic layer and the second conductive layer, and
  a nonmagnetic layer provided between the first magnetic layer and the second magnetic layer; and
 a controller including an output circuit electrically connected to the first conductive layer and the second conductive layer,
 the output circuit outputting a write pulse in a first operation,
 a resistance value per unit area of the nonmagnetic layer exceeding 20 $\Omega\mu m^2$,
 the write pulse including
  a rise period, a potential of the write pulse changing from a first potential toward a second potential in the rise period,
  an intermediate period of the second potential after the rise period, and
  a fall period after the intermediate period, the potential of the write pulse changing from the second potential toward the first potential in the fall period,
 a duration of the fall period being longer than a duration of the rise period.

Configuration 4
The magnetic memory device according to any one of Configurations 1 to 3, wherein
 a first time and a second time are in the rise period,
 the write pulse is a first intermediate potential at the first time, and a difference between the first potential and the first intermediate potential is 0.1 times a difference between the first potential and the second potential, the write pulse is a second intermediate potential at the second time, and a difference between the first potential and the second intermediate potential is 0.9 times the difference between the first potential and the second potential, a third time and a fourth time are in the fall period, the write pulse is the second intermediate potential at the third time, the write pulse is the first intermediate potential at the fourth time, and a second duration is longer than a first duration, the second duration being a difference between the third time and the fourth time, the first duration being a difference between the first time and the second time.

Configuration 5

The magnetic memory device according to Configuration 4, wherein the second duration is not less than 2 times the first duration.

Configuration 6

The magnetic memory device according to Configuration 4 or 5, wherein the first duration is 0.08 nanoseconds or less, and the second duration is 0.1 nanoseconds or more.

Configuration 7

The magnetic memory device according to any one of Configurations 1 to 6, wherein the duration of the rise period is 0.1 nanoseconds or less, and the duration of the fall period is 0.15 nanoseconds or more.

Configuration 8

The magnetic memory device according to any one of Configurations 1 to 7, wherein the duration of the fall period is not less than 2 times the duration of the rise period.

Configuration 9

The magnetic memory device according to any one of Configurations 1 to 8, wherein the duration of the fall period is not less than 0.3 times a pulse width of the write pulse.

Configuration 10

The magnetic memory device according to any one of Configurations 1 to 9, wherein the nonmagnetic layer includes magnesium oxide.

Configuration 11

The magnetic memory device according to any one of Configurations 1 to 10, wherein a second electrical resistance between the first conductive layer and the second conductive layer after the supplying of the write pulse is different from a first electrical resistance between the first conductive layer and the second conductive layer before the supplying of the write pulse.

Configuration 12

A method for controlling a magnetic memory device, comprising:

supplying a write pulse in a first operation to a stacked body, the stacked body including a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer, a resistance value per unit area of the nonmagnetic layer exceeding 20 $\Omega\mu m^2$, the write pulse including a rise period, a potential of the write pulse changing from a first potential toward a second potential in the rise period, an intermediate period of the second potential after the rise period, and a fall period after the intermediate period, the potential of the write pulse changing from the second potential toward the first potential in the fall period, a duration of the fall period being longer than a duration of the rise period.

Configuration 13

A method for controlling a magnetic memory device, comprising:

supplying a write pulse between one end of a first interconnect and one end of a second interconnect in a first operation, an other end of the first interconnect being electrically connected to a first conductive layer of a stacked body, the stacked body including the first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer, an other end of the second interconnect being electrically connected to the second conductive layer, a resistance value per unit area of the nonmagnetic layer exceeding 20 $\Omega\mu m^2$, the write pulse including a rise period, a potential of the write pulse changing from a first potential toward a second potential in the rise period, an intermediate period of the second potential after the rise period, and a fall period after the intermediate period, the potential of the write pulse changing from the second potential toward the first potential in the fall period, a duration of the fall period being longer than a duration of the rise period.

According to the embodiments, a magnetic memory device and a method for controlling the magnetic memory device can be provided in which stable operations are possible.

In this specification, the state of being electrically connected includes the state in which two conductors are in direct contact. The state of being electrically connected includes the state in which two conductors are connected by another conductor (e.g., an interconnect or the like). The state of being electrically connected includes the state in which a switching element (a transistor or the like) is provided between a path between two conductors so that a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as conductive layers, magnetic layers, nonmagnetic layers, controllers, control circuits, output circuits, interconnects, switches, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

REFERENCE NUMERAL LIST 10 stacked body
11 first magnetic layer
11N nonmagnetic layer
12 second magnetic layer
21, 22 first and second conductive layers
70 controller
70a, 70b first and second interconnects
70s switch
71 output circuit
71A, 71B first and second amplifiers
71C capacitance
71S control switch
72 control circuit
110 magnetic memory device
OP1, OP2 first and second operations
Pf fall period
Pm intermediate period
Pr rise period
Pw pulse width
RP read pulse
RPh height
Sc control signal
Se edge signal
So output signal
T1, T2 first and second durations
Tf fall time
Tr rise time
V1, V2 first and second potentials
VG ground potential
Vm1 to Vm3 first to third intermediate potentials
WER1 write error rate
WP write pulse
t1 to t4 first to fourth times
tm time

The invention claimed is:

1. A voltage torque-driven magnetic memory device, comprising:
   a stacked body including
      a first conductive layer,
      a second conductive layer,
      a first magnetic layer provided between the first conductive layer and the second conductive layer,
      a second magnetic layer provided between the first magnetic layer and the second conductive layer, and
      a nonmagnetic layer provided between the first magnetic layer and the second magnetic layer; and
   a controller supplying a write pulse to the stacked body in a first operation and being electrically connected to the first conductive layer and the second conductive layer,
   a resistance value per unit area of the nonmagnetic layer exceeding 20 $\Omega\mu m^2$,
   the write pulse including
      a rise period, a potential of the write pulse changing from a first potential toward a second potential in the rise period,
      an intermediate period of the second potential after the rise period, and
      a fall period after the intermediate period, the potential of the write pulse changing from the second potential toward the first potential in the fall period,
   a duration of the fall period being longer than a duration of the rise period, and
   (A) wherein
      the duration of the rise period is 0.1 nanoseconds or less, and
      the duration of the fall period is 0.15 nanoseconds or more,
   or
   (B) wherein
      a first time and a second time are in the rise period,
      the write pulse is a first intermediate potential at the first time, and a difference between the first potential and the first intermediate potential is 0.1 times a difference between the first potential and the second potential,
      the write pulse is a second intermediate potential at the second time, and a difference between the first potential and the second intermediate potential is 0.9 times the difference between the first potential and the second potential,
      a third time and a fourth time are in the fall period,
      the write pulse is the second intermediate potential at the third time,
      the write pulse is the first intermediate potential at the fourth time, and
      a second duration is longer than a first duration, the second duration being a difference between the third time and the fourth time, the first duration being a difference between the first time and the second time.

2. The device of claim 1, wherein
   a first time and a second time are in the rise period,
   the write pulse is a first intermediate potential at the first time, and a difference between the first potential and the first intermediate potential is 0.1 times a difference between the first potential and the second potential,
   the write pulse is a second intermediate potential at the second time, and a difference between the first potential and the second intermediate potential is 0.9 times the difference between the first potential and the second potential,
   a third time and a fourth time are in the fall period,
   the write pulse is the second intermediate potential at the third time,
   the write pulse is the first intermediate potential at the fourth time, and
   a second duration is longer than a first duration, the second duration being a difference between the third time and the fourth time, the first duration being a difference between the first time and the second time.

3. The device of claim 2, wherein the second duration is not less than 2 times the first duration.

4. The device of claim 2, wherein
   the first duration is 0.08 nanoseconds or less, and
   the second duration is 0.1 nanoseconds or more.

5. The device of claim 1, wherein
the duration of the rise period is 0.1 nanoseconds or less, and
the duration of the fall period is 0.15 nanoseconds or more.

6. The device of claim 1, wherein the duration of the fall period is not less than 2 times the duration of the rise period.

7. The device of claim 1, wherein the duration of the fall period is not less than 0.3 times a pulse width of the write pulse.

8. The device of claim 1, wherein the nonmagnetic layer includes magnesium oxide.

9. The device of claim 1, wherein a second electrical resistance between the first conductive layer and the second conductive layer after the supplying of the write pulse is different from a first electrical resistance between the first conductive layer and the second conductive layer before the supplying of the write pulse.

10. A voltage torque-driven magnetic memory device, comprising:
a stacked body including
a first conductive layer,
a second conductive layer,
a first magnetic layer provided between the first conductive layer and the second conductive layer,
a second magnetic layer provided between the first magnetic layer and the second conductive layer, and
a nonmagnetic layer provided between the first magnetic layer and the second magnetic layer;
a first interconnect;
a second interconnect; and
a controller,
a resistance value per unit area of the nonmagnetic layer exceeding 20 $\Omega\mu m^2$,
the controller being electrically connected to one end of the first interconnect, and the first conductive layer being electrically connected to an other end of the first interconnect,
the controller being electrically connected to one end of the second interconnect, and the second conductive layer being electrically connected to an other end of the second interconnect,
the controller being electrically connected to the first conductive layer and the second conductive layer and supplying a write pulse between the one end of the first interconnect and the one end of the second interconnect in a first operation,
the write pulse including
a rise period, a potential of the write pulse changing from a first potential toward a second potential in the rise period,
an intermediate period of the second potential after the rise period, and
a fall period after the intermediate period, the potential of the write pulse changing from the second potential toward the first potential in the fall period,
a duration of the fall period being longer than a duration of the rise period, and
(A) wherein
the duration of the rise period is 0.1 nanoseconds or less, and
the duration of the fall period is 0.15 nanoseconds or more,
or
(B) wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

11. The device of claim 10, wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

12. The device of claim 10, wherein
the duration of the rise period is 0.1 nanoseconds or less, and
the duration of the fall period is 0.15 nanoseconds or more.

13. A voltage torque-driven magnetic memory device, comprising:
a stacked body including
a first conductive layer,
a second conductive layer,
a first magnetic layer provided between the first conductive layer and the second conductive layer,
a second magnetic layer provided between the first magnetic layer and the second conductive layer, and
a nonmagnetic layer provided between the first magnetic layer and the second magnetic layer; and
a controller including an output circuit electrically connected to the first conductive layer and the second conductive layer,
the output circuit outputting a write pulse in a first operation,
a resistance value per unit area of the nonmagnetic layer exceeding 20 $\Omega\mu m^2$,
the write pulse including
a rise period, a potential of the write pulse changing from a first potential toward a second potential in the rise period,
an intermediate period of the second potential after the rise period, and a fall period after the intermediate period, the potential of the write pulse changing from the second potential toward the first potential in the fall period,
a duration of the fall period being longer than a duration of the rise period, and
(A) wherein
the duration of the rise period is 0.1 nanoseconds or less, and
the duration of the fall period is 0.15 nanoseconds or more,
or
(B) wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

14. The device of claim 13, wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

15. The device of claim 13, wherein
the duration of the rise period is 0.1 nanoseconds or less, and
the duration of the fall period is 0.15 nanoseconds or more.

16. A method for controlling a voltage torque-driven magnetic memory device, comprising:
supplying a write pulse in a first operation to a stacked body, the stacked body including a first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer,
a resistance value per unit area of the nonmagnetic layer exceeding 20 $\Omega\mu m^2$,
the write pulse including
a rise period, a potential of the write pulse changing from a first potential toward a second potential in the rise period,
an intermediate period of the second potential after the rise period, and
a fall period after the intermediate period, the potential of the write pulse changing from the second potential toward the first potential in the fall period,
a duration of the fall period being longer than a duration of the rise period, and
(A) wherein
the duration of the rise period is 0.1 nanoseconds or less, and
the duration of the fall period is 0.15 nanoseconds or more,
or
(B) wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

17. The method of claim 16, wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

18. The method of claim 16, wherein
the duration of the rise period is 0.1 nanoseconds or less, and
the duration of the fall period is 0.15 nanoseconds or more.

19. A method for controlling a voltage torque-driven magnetic memory device, comprising:

supplying a write pulse between one end of a first interconnect and one end of a second interconnect in a first operation,
an other end of the first interconnect being electrically connected to a first conductive layer of a stacked body, the stacked body including the first conductive layer, a second conductive layer, a first magnetic layer provided between the first conductive layer and the second conductive layer, a second magnetic layer provided between the first magnetic layer and the second conductive layer, and a nonmagnetic layer provided between the first magnetic layer and the second magnetic layer,
an other end of the second interconnect being electrically connected to the second conductive layer,
a resistance value per unit area of the nonmagnetic layer exceeding 20 $\Omega\mu m^2$,
the write pulse including
- a rise period, a potential of the write pulse changing from a first potential toward a second potential in the rise period,
- an intermediate period of the second potential after the rise period, and
- a fall period after the intermediate period, the potential of the write pulse changing from the second potential toward the first potential in the fall period, a duration of the fall period being longer than a duration of the rise period, and (A) wherein
the duration of the rise period is 0.1 nanoseconds or less, and
the duration of the fall period is 0.15 nanoseconds or more,
or
(B) wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

20. The method of claim 19, wherein
a first time and a second time are in the rise period,
the write pulse is a first intermediate potential at the first time, and a difference between the first potential and the first intermediate potential is 0.1 times a difference between the first potential and the second potential,
the write pulse is a second intermediate potential at the second time, and a difference between the first potential and the second intermediate potential is 0.9 times the difference between the first potential and the second potential,
a third time and a fourth time are in the fall period,
the write pulse is the second intermediate potential at the third time,
the write pulse is the first intermediate potential at the fourth time, and
a second duration is longer than a first duration, the second duration being a difference between the third time and the fourth time, the first duration being a difference between the first time and the second time.

* * * * *